US006729891B2

(12) United States Patent
Egan et al.

(10) Patent No.: US 6,729,891 B2
(45) Date of Patent: May 4, 2004

(54) RIGHT ANGLE BOARD-TO-BOARD CONNECTOR WITH BALANCED IMPEDANCE

(75) Inventors: Patrick Kevin Egan, Rochester, MN (US); Jill Marie Golat, Boulder, CO (US); Brian Joseph Stanczyk, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/164,156

(22) Filed: Jun. 6, 2002

(65) Prior Publication Data

US 2003/0228776 A1 Dec. 11, 2003

(51) Int. Cl.[7] ............................................... H01R 12/00
(52) U.S. Cl. ........................................... 439/79; 439/78
(58) Field of Search .............................. 439/79, 78, 65, 439/541.5, 540.1, 854, 855

(56) References Cited

U.S. PATENT DOCUMENTS 5,173,056 A * 12/1992 Kniese et al. ................ 439/79
5,201,662 A * 4/1993 Roche .......................... 439/79
5,240,422 A * 8/1993 Kobayashi et al. ........... 439/78
5,522,727 A * 6/1996 Saito et al. .................... 439/65
5,676,554 A * 10/1997 Tsuji ............................ 439/79
5,688,129 A * 11/1997 Flaherty ....................... 439/79

OTHER PUBLICATIONS

U.S. patent application Ser. No. 10/120,878 filed Apr. 11, 2002, "Right Angle Board to Board Power Connector".

* cited by examiner

*Primary Examiner*—P. Austin Bradley
*Assistant Examiner*—Edwin A. Leon
(74) *Attorney, Agent, or Firm*—Joan Pennington

(57) ABSTRACT

A right angle board-to-board connector is provided with generally balanced impedance. The right angle board-to-board connector includes a plurality of connector pins. Each of the connector pins has a generally right angle configuration. The connector pins are spaced apart by a substantially uniform spacing along respective connector mating pin faces. Selected connector pins have substantially equal length. For example, each of the connector pins has substantially equal length or selected pairs of the connector pins has substantially equal length. The connector pins of a preferred embodiment are laterally offset to provide a predefined separation between the connector pins at pin crossover locations.

9 Claims, 5 Drawing Sheets

RIGHT ANGLE BOARD-TO-BOARD CONNECTOR WITH BALANCED IMPEDANCE

FIELD OF THE INVENTION

The present invention relates generally to the connectors, and more particularly, relates to a right angle board-to-board connector having generally balanced impedance.

DESCRIPTION OF THE RELATED ART

Physical limitations for board-to-board connections in some instances require the use of right angle connectors. When right angle connectors are used to carry signals, problems can be caused by the differences in impedance of each row of contacts.

FIG. 1 illustrates a prior art right angle board-to-board connector. As shown, the prior art right angle board-to-board connector includes three connector pins each having right angle configurations and having respective lengths of 2X, 4X, and 6X. In the prior art right angle three row board-to-board connector, the impedance including resistance and inductance of the three pins is proportional to the respective pen length 2X, 4X, and 6X. The unbalanced pin impedance of the prior art right angle board-to-board connector limits the use for this connector, particularly for carrying high frequency signals.

One known right angle connector addresses balancing the resistance of the pins of the connector, while maintaining the conventional pin configuration, as shown in FIG. 1. In this connector the thickness of the pins are varied to so that each pin has a resistance substantially equal to the other pins. While the difference in resistance is balanced by making the longer pins thicker, the pin lengths remain the same as the conventional pin configuration shown in FIG. 1, so that inductance in the pins is not balanced.

With high speed signals, it is important to substantially balance the total impedance including resistance and inductance of the multiple pins in the connector.

A need exists for an improved right angle board-to-board connector. It is desirable to provide a right angle board-to-board connector having generally balanced impedance.

SUMMARY OF THE INVENTION

A principal object of the present invention is to provide a right angle board-to-board connector having generally balanced impedance. Other important objects of the present invention are to provide such a right angle board-to-board connector having generally balanced impedance substantially without negative effect and that overcome many of the disadvantages of prior art arrangements.

In brief, a right angle board-to-board connector is provided with generally balanced impedance. The right angle board-to-board connector includes a plurality of connector pins. Each of the connector pins has a generally right angle configuration. The connector pins are spaced apart by a substantially uniform spacing along respective connector mating pin faces. Selected connector pins have substantially equal length. For example, each of the connector pins has substantially equal length or selected pairs of the connector pins has substantially equal length.

In accordance with features of the invention, the connector pins are laterally offset to provide a predefined space between the connector pins at pin crossover locations.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2:
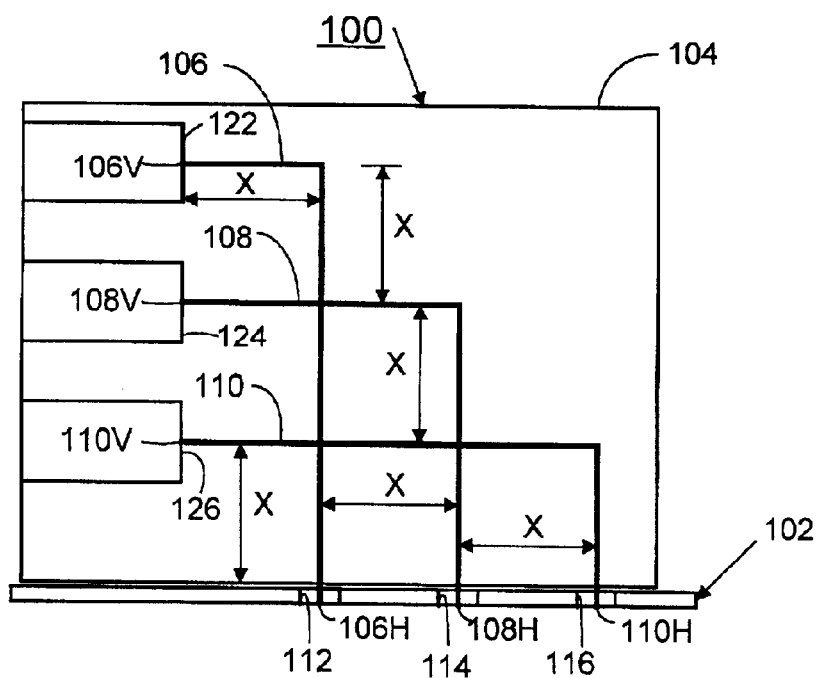
FIG. 2 is a diagram illustrating a side view of an exemplary right angle board-to-board connector in accordance with the preferred embodiment.
Figure 3:
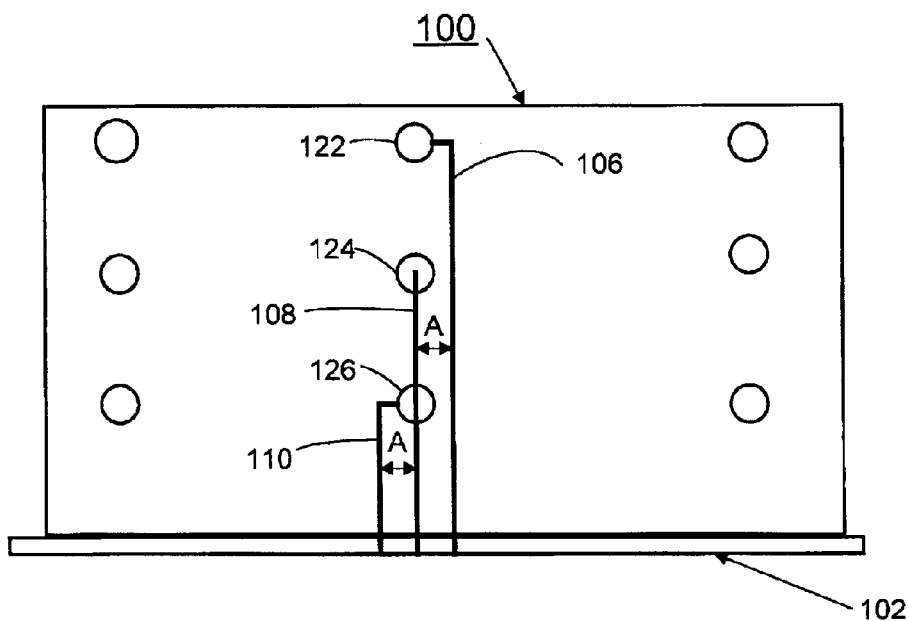
FIG. 3 is a diagram illustrating a front view of the exemplary right angle board-to-board connector of FIG. 2 in accordance with the preferred embodiment.
Figure 4:
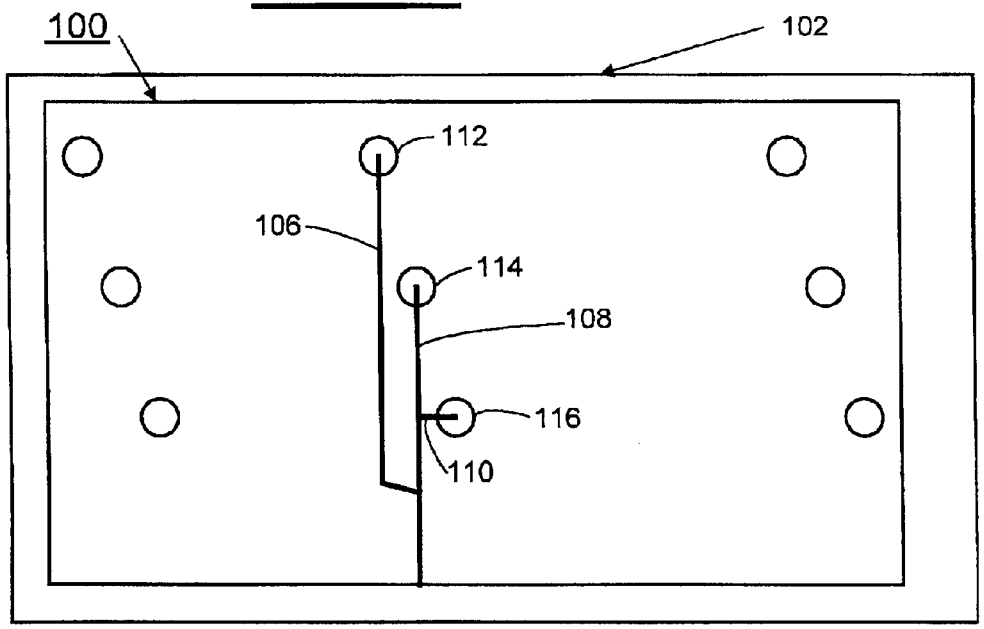
FIG. 4 is a diagram illustrating a top view of the exemplary right angle board-to-board connector of FIG. 2 in accordance with the preferred embodiment.

Having reference now to the drawings, in FIGS. 2, 3 and 4, there is shown an exemplary right angle board-to-board connector in accordance with the preferred embodiment generally designated by the reference character 100. Right angle board-to-board connector 100 is shown with a circuit board 102. Right angle board-to-board connector 100 includes a housing 104 containing a plurality of connector pins 106, 108 and 110, for example, three conductor pins. Connector housing 104 is formed of an electrically insulating material. Right angle board-to-board connector 100 is shown in simplified form sufficient for understanding of the invention.

In accordance with features of the preferred embodiment, right angle board-to-board connector 100 substantially balances inductance and resistance between the different rows of pins 106, 108, and 110 with each pin 106, 108, and 110 having substantially equal length. The rows of the connector 100 are flipped between one side of the right angle connector and the other side in the preferred embodiment.

Each of connector pins 106, 108 and 110 has a generally right angle configuration. Each of connector pins 106, 108 and 110 has a respective end portion or mating face 106H, 108H, 110H received with a respective opening 112, 114, 116 in the circuit board 102. Each respective other end portion 106V, 108V, 110V of the connector pins 106, 108 and 110 is received with a respective opening 122, 124, 126 for connection to a second circuit board (not shown). Each of connector pins 106, 108 and 110 are rigid members, formed of an electrically conductive material having sufficient strength, for example, for press-fit engagement within the mating circuit board openings 112, 114, 116. Each of the connector pins 106, 108 and 110 has substantially equal thickness and width dimensions.

Figure 1:
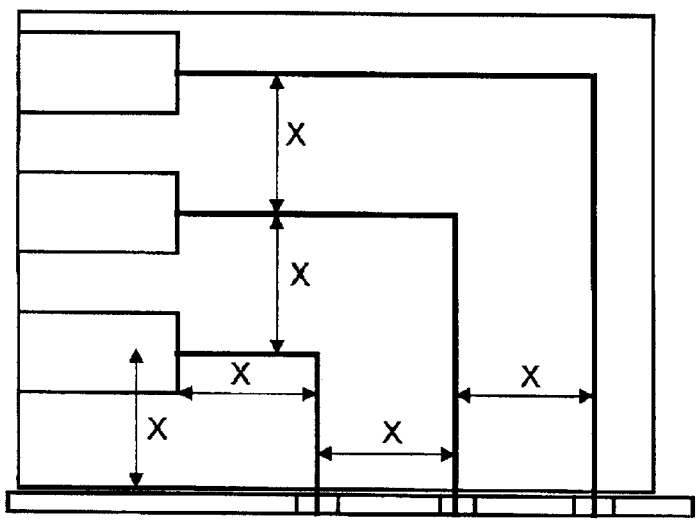
FIG. 1 is a diagram illustrating a side view of a prior art right angle board-to-board connector.

As best seen in FIG. 2, flipped rows are used as compared to the prior art connector of FIG. 1 to create the substantially equal length for each pin 106, 108, and 110, hence balancing both resistance and inductance. The upper or top pin 106 goes to the near opening 112 on the board 102, the middle pin 108 goes to the middle opening 114 and the bottom pin 110 goes to the far opening 116 on the board 102. A uniform spacing labeled X is provided between the pins 106, 108, and 110 along mating terminal faces between the respective openings 122, 124, 126 and between respective openings 112, 114, 116 in the circuit board 102.

As shown in FIG. 2, all pins 106, 108, and 110 have a substantially equal length of 4X. The equal length pin configuration results in crossovers of pin 106 with pins 108 and 110 and of pin 108 with pin 110. The conventional straight line routing of the pins 106, 108, and 110 is not preferred due to the problem resulting from the pins crossing each other in three locations of the equal length pin configuration that must be overcome.

FIG. 3 shows how the mechanical problems of the pins crossing each other can be easily accommodated in accordance with the preferred embodiment. By placing the board pins 106, 108 and 110 out at an angle or with lateral offsets indicated by arrows labeled A, instead of in a straight line, provides separation between the pins 106, 108 and 110 at crossover locations allowing the pins to avoid each other in the housing 104. The pins 106, 108 and 110 are placed in a specific order from bottom to top in the housing 104 to build the right angle board-to-board connector 100. In other words, the connector pin 110 is first installed, then the middle connector pin 108 is installed and then the top connector pin 110 is placed in the housing 104.

FIG. 4 illustrates a footprint of the openings 112, 114, 116 in the circuit board 102. As shown, a staggered arrangement of the openings 112, 114, 116 in the circuit board 102, instead of in a straight line, is provided corresponding the staggered pin placement of the contact pins 106, 108 and 110 of the right angle board-to-board connector 100 of the preferred embodiment.

It should be understood that the connector pins 106, 108 and 110 could still be arranged in a row, but this would require that the pins be bent around each other and be inserted as one unit into the connector 100.

It should be noted that the small stagger caused by the pins being at an angle on the board causes a small difference in pin length between the top pin 106 and bottom pin 110 to the center pin 108. Adding a small length to the middle pin 108 or subtracting length from the top and bottom pins could correct this small pin length difference. For example, this could be done by not bending the pins 106, 108 and 110 at right angles in the connector housing 102. An angle could be used to off set the delta caused by the pin location on the circuit board.

Figure 5:
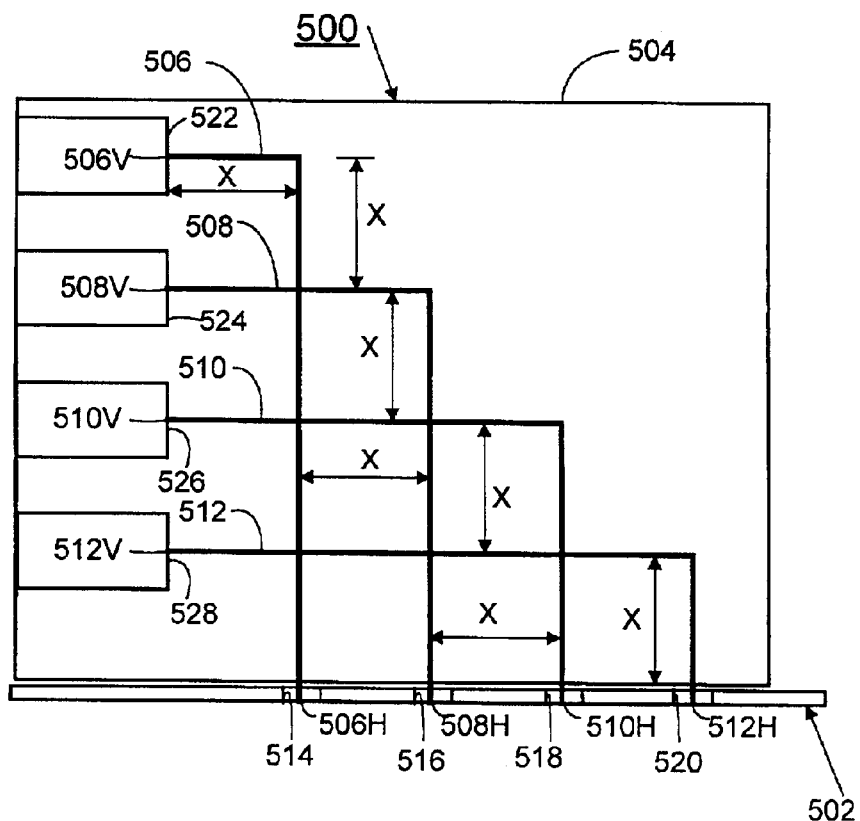
FIG. 5 is a diagram illustrating a side view of another exemplary right angle board-to-board connector in accordance with the preferred embodiment.

Referring now to FIG. 5, there is shown another exemplary right angle board-to-board connector in accordance with the preferred embodiment generally designated by the reference character 500. Right angle board-to-board connector 500 is shown with a circuit board 502. Right angle board-to-board connector 500 includes a housing 504 containing a plurality of connector pins 506, 508, 510, and 512, for example, four conductor pins. Connector housing 504 is formed of an electrically insulating material. Right angle board-to-board connector 500 is shown in simplified form sufficient for understanding of the invention.

Each of connector pins 506, 508, 510, and 512 has a generally right angle configuration. Each of connector pins 506, 508, 510, and 512 has a respective end portion or mating face 506H, 508H, 510H, 512H received with a respective opening 514, 516, 518, 520 in the circuit board 502. Each respective other end portion 506V, 508V, 510V, 512V of the connector pins 506, 508, 510, and 512 is received with a respective opening 522, 524, 526, 528 for connection to a second circuit board (not shown). Each of the connector pins 506, 508, 510, and 512 are rigid members, formed of an electrically conductive material having sufficient strength, for example, for press-fit engagement within the mating circuit board openings 514, 516, 518, 520. Each of the connector pins 506, 508, 510, and 512 has substantially equal thickness and width dimensions.

As shown in FIG. 5, the present invention also applies to connectors having an even number of pins, such as connector 500. Each pin 506, 508, 510, and 512 has substantially equal length, hence balancing both resistance and inductance. A uniform spacing labeled X is provided between the pins 506, 508, 510, and 512 along mating terminal faces between the respective openings 522, 524, 526, 528 and between respective openings 514, 516, 518, 520 in the circuit board 502. As shown in FIG. 5, each of the connector pins 506, 508, 510, and 512 has a substantially equal path length of 5X.

Figure 6:
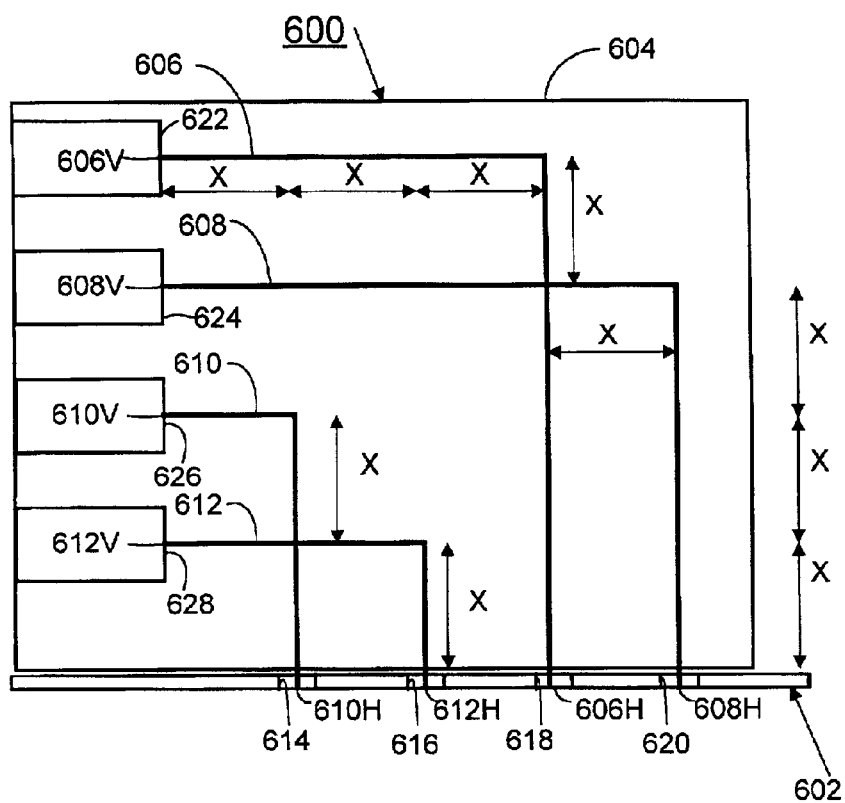
FIG. 6 is a diagram illustrating a side view of a further exemplary angle board-to-board connector in accordance with the preferred embodiment.

Referring now to FIG. 6, there is shown another exemplary right angle board-to-board connector in accordance with the preferred embodiment generally designated by the reference character 600. Right angle board-to-board connector 600 is shown with a circuit board 602. Right angle board-to-board connector 600 includes a housing 604 formed of an electrically insulating material. Right angle board-to-board connector 600 is shown in simplified form sufficient for understanding of the invention.

In accordance with features of the present invention, right angle board-to-board connector 600 is arranged to create matched pairs of conductors with matched impedance. As shown in FIG. 6, impedance can be matched between adjacent rows. Right angle board-to-board connector 600 includes a plurality of connector pins 606, 608, 610, and 612, for example, four conductor pins. A first pair of connector pins 606 and 608 has substantially equal length, hence balancing both resistance and inductance. A second pair of connector pins 610 and 612 has substantially equal length, hence balancing both resistance and inductance.

Each of connector pins 606, 608, 610, and 612 has a generally right angle configuration. Each of connector pins 606, 608, 610, and 612 has a respective end portion or mating face 606H, 608H, 610H, 612H received with a respective opening 618, 620, 614, 616 in the circuit board 602. Each respective other end portion 606V, 608V, 610V, 612V of the connector pins 606, 608, 610, and 612 is received with a respective opening 622, 624, 626, 628 for connection to a second circuit board (not shown). Each of the connector pins 606, 608, 610, and 612 are rigid members, formed of an electrically conductive material having sufficient strength, for example, for press-fit engagement within the mating circuit board openings 618, 620, 614, 616. Each of the connector pins 606, 608, 610, and 612 has substantially equal thickness and width dimensions.

As shown in FIG. 6, the present invention also applies to connectors having selected ones of the pins 606, 608, 610, and 612 having substantially equal length, hence balancing both resistance and inductance. A uniform spacing labeled X is provided between the pins 606, 608, 610, and 612 along mating terminal faces between the respective openings 622, 624, 626, 628 and between respective openings 614, 616, 618, 620 in the circuit board 602. As shown in FIG. 6, the first adjacent pair of connector pins 606 and 608 has a substantially equal path length of 7X and the second adjacent pair of connector pins 610 and 612 has a substantially equal path length of 3X.

It should be understood that the present invention is not limited to pairs of adjacent pins 606 and 608, and 610 and 612 having a substantially equal path length, as shown in FIG. 6. For example, various selected ones of multiple pins can be arranged to create matched conductors with matched impedance.

Figure 7:
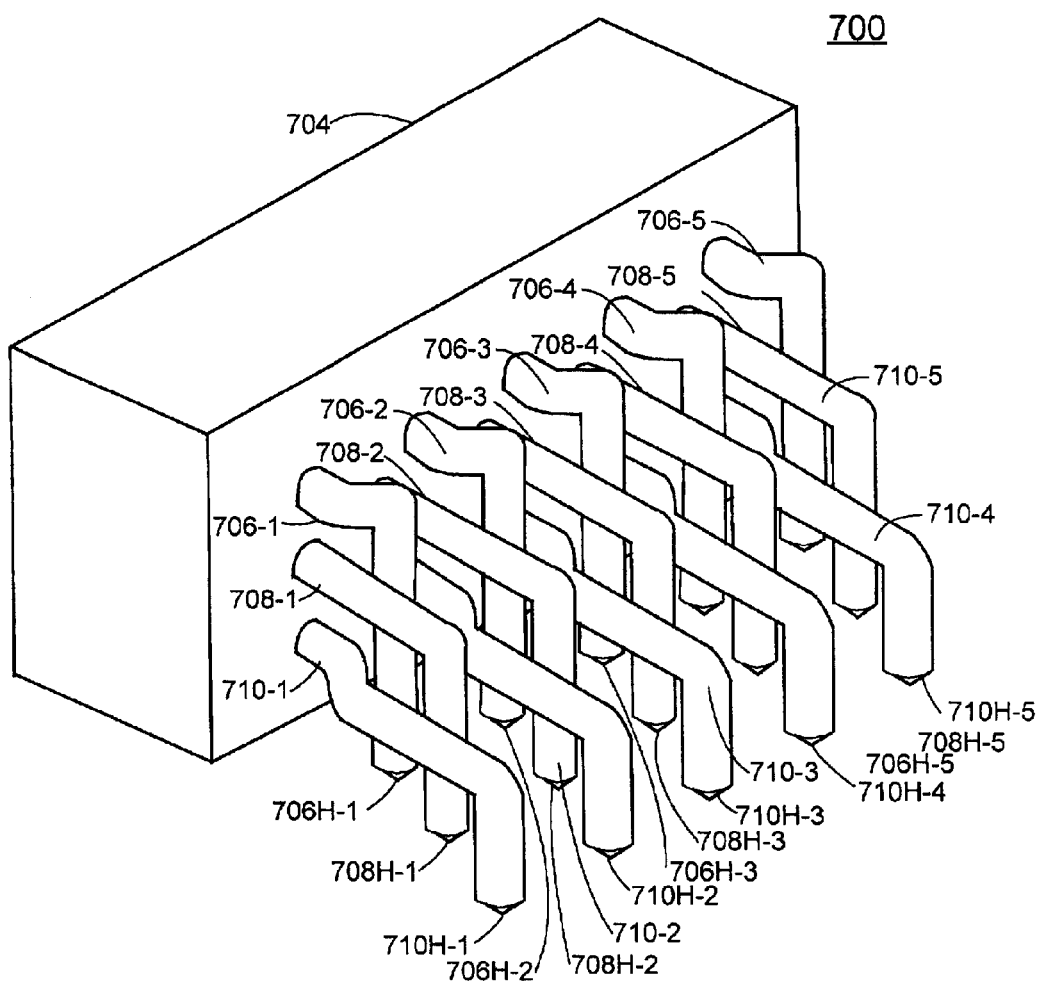
FIG. 7 is a perspective view of another exemplary right angle board-to-board connector in accordance with the preferred embodiment.

FIG. 7 generally illustrates not shown to scale another exemplary right angle board-to-board connector in accordance with the preferred embodiment generally designated by the reference character 700. Right angle board-to-board connector 700 is shown with a housing 704. Connector housing 704 is formed of an electrically insulating material.

As shown in FIG. 7, board-to-board connector 700 includes five groups of three conductor pins, each group of three conductor pins generally arranged as pins 106, 108, 110 shown in FIGS. 2, 3 and 4. Right angle board-to-board connector 700 includes a plurality of connector pins 706-1, 708-1 and 710-1, 706-2, 708-2 and 710-2, 706-3, 708-3 and 710-3, 706-4, 708-4 and 710-4, and 706-5, 708-5 and 710-5.

Each of connector pins 706-1, 708-1 and 710-1, 706-2, 708-2 and 710-2, 706-3, 708-3 and 710-3, 706-4, 708-4 and 710-4, and 706-5, 708-5 and 710-5 has a generally right angle configuration. Each of connector pins 706-1, 708-1 and 710-1, 706-2, 708-2 and 710-2, 706-3, 708-3 and 710-3, 706-4, 708-4 and 710-4, and 706-5, 708-5 and 710-5 has a respective end portion or mating face 706H-1, 708H-1 and 710H-1, 706H-2, 708H-2 and 710H-2, 706H-3, 708H-3 and 710H-3, 706H-4, 708H-4 and 710H-4, and 706H-5, 708H-5 and 710H-5 extending in a plane and received with a respective opening in a mating circuit board (not shown). A staggered arrangement of the openings in the mating circuit board is provided corresponding the staggered pin placement of the contact pins 706-1, 708-1 and 710-1, 706-2, 708-2 and 710-2, 706-3, 708-3 and 710-3, 706-4, 708-4 and 710-4, and 706-5, 708-5 and 710-5 of the right angle board-to-board connector 700 of the preferred embodiment, generally as illustrated in FIG. 4.

Right angle board-to-board connector 700 substantially balances inductance and resistance with each of the pins 706-1, 708-1 and 710-1, 706-2, 708-2 and 710-2, 706-3, 708-3 and 710-3, 706-4, 708-4 and 710-4, and 706-5, 708-5 and 710-5 having substantially equal length. Each of the connector pins 706-1, 708-1 and 710-1, 706-2, 708-2 and 710-2, 706-3, 708-3 and 710-3, 706-4, 708-4 and 710-4, and 706-5, 708-5 and 710-5 has substantially equal thickness and width dimensions. Each of the connector pins 706-1, 708-1 and 710-1, 706-2, 708-2 and 710-2, 706-3, 708-3 and 710-3, 706-4, 708-4 and 710-4, and 706-5, 708-5 and 710-5 are rigid members, formed of an electrically conductive material having sufficient strength, for example, for press-fit engagement within the mating circuit board openings.

While the present invention has been described with reference to the details of the embodiments of the invention shown in the drawing, these details are not intended to limit the scope of the invention as claimed in the appended claims.

What is claimed is:

1. A right angle board-to-board connector comprising:
  a plurality of connector pins; each of said connector pins having a generally right angle configuration and being spaced apart by a substantially uniform spacing along first and second mating connector faces;
  said plurality of connector pins including staggered lateral offsets in first and second directions between said plurality of connector pins along one of said first and second mating connector faces providing separation at each crossover location between adjacent connector pins;
  each of said connector pins having substantially equal length;
  an upper connector pin of said plurality of connector pins having a lateral offset in said first direction from a middle connector pin being connected to an inner circuit board opening;
  said middle connector pin of said plurality of connector pins being connected to a middle circuit board opening; said middle circuit board opening being spaced apart from said inner circuit board opening by said lateral offset in said first direction; and
  a lower connector pin of said plurality of connector pins having a lateral offset in said second direction from a middle connector pin being connected to an outer circuit board opening; said outer circuit board opening being spaced apart from said middle circuit board opening by said lateral offset in said second direction.

2. A right angle board-to-board connector as recited in claim 1 wherein each of said plurality of connector pins has substantially equal thickness and width dimensions.

3. A right angle board-to-board connector as recited in claim 1 wherein said plurality of connector pins are formed of an electrically conductive material having sufficient strength for press-fit engagement of said plurality of connector pins within the mating circuit board openings.

4. A right angle board-to-board connector as recited in claim 1 wherein each of said plurality of connector pins is a rigid member.

5. A right angle board-to-board connector with generally balanced impedance comprising:
  a plurality of groups of connector pins; each of said connector pins having a generally right angle configuration and each said group of connector pins being spaced apart by a substantially uniform spacing along first and second mating connector faces;
  said connector pins arranged with substantially equal length;
  each said group of connector pins including staggered lateral offsets in first and second directions between said group of connector pins along one of said first and second mating connector faces providing separation between said group of connector pins at each crossover location between adjacent connector pins;
  each said group of connector pins including:
    an upper connector pin of said plurality of connector pins having a lateral offset in said first direction from a middle connector pin being connected to an inner circuit board opening;
    said middle connector pin of said plurality of connector pins being connected to a middle circuit board opening; said middle circuit board opening being spaced apart from said inner circuit board opening by said lateral offset in said first direction; and
    a lower connector pin of said plurality of connector pins having a lateral offset in said second direction from a middle connector pin being connected to an outer circuit board opening; said outer circuit board opening being spaced apart from said middle circuit board opening by said lateral offset in said second direction.

6. A right angle board-to-board connector with generally balanced impedance as recited in claim 5 wherein each of said plurality of connector pins is a rigid member.

7. A right angle board-to-board connector with generally balanced impedance as recited in claim 5 wherein each of said plurality of connector pins has substantially equal thickness and width dimensions.

8. A right angle board-to-board connector with generally balanced impedance as recited in claim 5 wherein said plurality of connector pins are formed of an electrically conductive material having sufficient strength for press-fit engagement of said plurality of connector pins within the mating circuit board openings.

9. A right angle board-to-board connector with generally balanced impedance as recited in claim 5 includes a housing containing said plurality of connector pins.

* * * * *